(12) United States Patent
Chen et al.

(10) Patent No.: US 6,924,531 B2
(45) Date of Patent: Aug. 2, 2005

(54) LDMOS DEVICE WITH ISOLATION GUARD RINGS

(75) Inventors: Fu-Hsin Chen, Gaoshu (TW); Ruey-Hsin Liu, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 10/676,703

(22) Filed: Oct. 1, 2003

(65) Prior Publication Data

US 2005/0073007 A1 Apr. 7, 2005

(51) Int. Cl.⁷ .............................................. H01L 29/76
(52) U.S. Cl. ...................... 257/336; 257/337; 257/343; 257/409; 257/122; 257/126
(58) Field of Search ................. 257/336, 335, 257/337, 343, 344, 345, 409, 122, 126, 127

(56) References Cited

U.S. PATENT DOCUMENTS

| | | | |
|---|---|---|---|
| 6,169,309 B1 * | 1/2001 | Teggatz et al. ............. | 257/328 |
| 6,468,870 B1 | 10/2002 | Kao et al. | |
| 6,475,870 B1 | 11/2002 | Huang et al. | |
| 6,486,034 B1 | 11/2002 | Huang et al. | |
| 6,580,131 B2 | 6/2003 | Huang et al. | |
| 6,593,621 B2 * | 7/2003 | Tsuchiko et al. ............. | 257/335 |
| 6,642,551 B2 * | 11/2003 | Zommer ...................... | 257/127 |
| 6,727,547 B1 * | 4/2004 | Brisbin et al. ............... | 257/335 |
| 6,747,294 B1 * | 6/2004 | Gupta et al. ................. | 257/127 |

* cited by examiner

Primary Examiner—Nathan J. Flynn
Assistant Examiner—Remmon R. Fordé
(74) Attorney, Agent, or Firm—Slater & Matsil, L.L.P.

(57) ABSTRACT

A method of forming a LDMOS semiconductor device and structure for same. A preferred embodiment comprises forming a first guard ring around and proximate the drain of a LDMOS device, and forming a second guard ring around the first guard ring. The first guard ring comprises a P+ base guard ring, and the second guard ring comprises an N+ collector guard ring formed in a deep N-well, in one embodiment. The first guard ring and second guard ring prevent leakage current from flowing from the drain of the LDMOS device to the substrate.

13 Claims, 12 Drawing Sheets

LDMOS DEVICE WITH ISOLATION GUARD RINGS

TECHNICAL FIELD

The present invention relates generally to semiconductor devices, and more particularly to a lateral double-diffused metal oxide semiconductor (LDMOS) device and method of manufacture thereof.

BACKGROUND

An LDMOS device is basically a metal oxide semiconductor field effect transistor (MOSFET) fabricated using a double-diffusion process with coplanar drain and source regions. A prior art LDMOS device 100 is shown in a cross-sectional view in FIG. 1. An N+ buried layer 104 of silicon is formed within the top portion of a P-substrate 102. A high voltage P well (HVPW) 108 extends downwardly from the top surface of the substrate 102. The HVPW 108 includes an N+ source 110 having a distance L from the junction between an adjacent high voltage N well (HVNW) 106 and the N+ source 110, wherein distance L defines the channel of the device 100. A gate 112 is formed proximate the source 110 over a field oxide (FOX). The LDMOS device 100 includes a drain 114 comprising an N+ material formed in the HVNW 106, as shown. Applying a positive voltage to the gate 112 induces a current to flow through the channel from the N+ source 110 into the HVNW 106 to be collected at the N+ drain 114.

Figure 1:
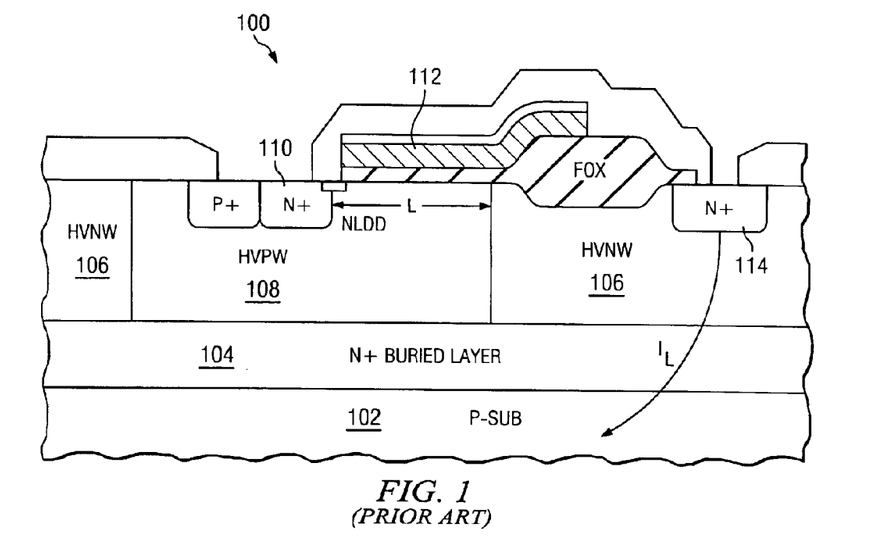
FIG. 1 shows a cross-sectional view of a prior art LDMOS device having a leakage current from the drain to the substrate.

A problem with the prior art LDMOS device 100 shown in FIG. 1 is that if the LDMOS device 100 is connected to an inductor load, such as to drive a digital versatile disc (DVD), a transient negative voltage may be fed back at the drain 114 when the power is off. The transient negative voltage can create leakage current. The leakage current results from a forward bias voltage in the PN diode creating leakage current from the drain 114 to the substrate 102, as shown in FIG. 1 at $I_L$.

Figure 2:
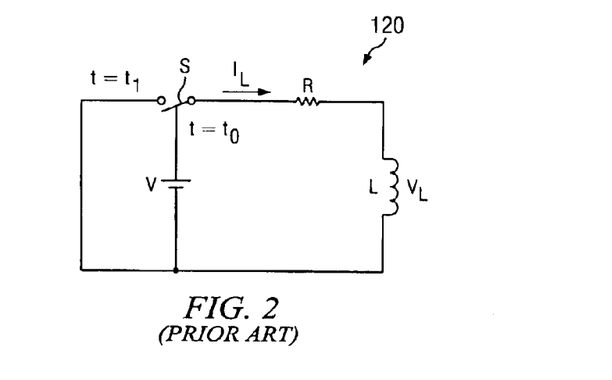
FIG. 2 is a schematic diagram showing a model of the source of the leakage current.

A schematic diagram 120 of a model of this leakage current $I_L$ phenomenon is shown in FIG. 2. In the schematic 120, the voltage V represents a voltage across drain 114 to P-substrate 102, resistor R represents the resistance between the drain 114 and the P-Substrate 102, and the inductor L represents an inductor load. At time=$t_0$, when power is turned off of the device 100, effectively, switch S is switched, causing the leakage current $I_L$ to flow from the drain 114 to the substrate 102. This leakage $I_L$ degrades device performance, causing a latch-up effect, early breakdown, and reliability issues for the LDMOS device 100, as examples.

Figure 3:
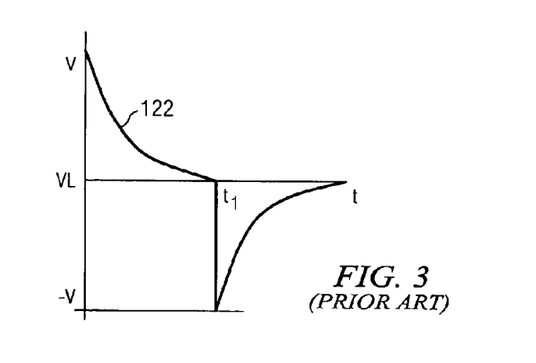
FIG. 3 illustrates a curve of the voltage $V_L$ that causes the leakage current $I_L$.

A chart showing the voltage $V_L$, which creates the leakage current $I_L$ discussed herein with reference to FIGS. 1 and 2 is shown at 122 in FIG. 3. For example, a positive voltage exists at the drain when the LDMOS device 100 is turned on, e.g., when a positive voltage V is applied to the gate 112. A negative voltage spike $-V$ is produced at time $t=t_1$ when the power is turned off of the device 100, e.g., when the positive voltage V is removed from the gate 112.

What is needed in the art is a LDMOS device and method of manufacturing thereof that does not have the drain 114 to substrate 102 leakage current problems experienced in prior art LDMOS devices 100.

SUMMARY OF THE INVENTION

These and other problems are generally solved or circumvented, and technical advantages are generally achieved, by preferred embodiments of the present invention which provide an LDMOS device and method of manufacture thereof wherein leakage current from the drain to the substrate is prevented by the use of a first and second guard ring disposed proximate and around the drain region of the LDMOS device. The first and second guard rings form an NPN parasitic transistor and provide self-isolation for the drain of the LDMOS device.

In accordance with a preferred embodiment of the present invention, a method of manufacturing a semiconductor device includes forming a LDMOS device in a substrate, the LDMOS device including a drain, forming a first guard ring around and proximate the drain of the LDMOS device, and forming a second guard ring around the first guard ring.

In accordance with another preferred embodiment of the present invention, a method of manufacturing a LDMOS device includes providing a substrate, the substrate including a first semiconductor type, and forming a first pad dielectric on a top surface of the substrate. A buried layer is formed in a top region of the substrate, the buried layer including a second semiconductor type. The first pad dielectric is removed, and a doped semiconductor material is deposited over the buried layer, the doped semiconductor material being doped with the first semiconductor type. A second pad dielectric is formed over the doped semiconductor material, a portion of the doped semiconductor material is doped to form a deep well region, the deep well region comprising an annular ring shape, and a portion of the doped semiconductor material is doped to form at least one first high voltage well region. The method includes doping a portion of the doped semiconductor material to form a second high voltage well region, the second high voltage well region comprising an annular shape disposed within a central portion of the annular deep well region, depositing a dielectric layer over the second pad dielectric, patterning the dielectric layer, removing exposed portions of the second pad dielectric, and forming field dielectric over portions of the second high voltage well region and at least one first high voltage well region using the dielectric layer as a mask. The dielectric layer and remaining portions of the second pad dielectric are removed, and a gate dielectric and gate of the LDMOS device are formed over portions of the second high voltage well region and the at least one first high voltage well region and a portion of the field dielectric. The method includes simultaneously doping the annular deep well region, a portion of the second high voltage well region and a portion of the at least one high voltage well region with a dopant of the second semiconductor type to form a first guard ring in the deep well region, a source of the LDMOS device in the second region, and a drain of the LDMOS device in the at least one first high voltage well region. A portion of the annular second high voltage well region is doped with a dopant of the first semiconductor type to form a second guard ring in the second high voltage well region, the second guard ring being formed in a central region of the first guard ring.

In accordance with yet another preferred embodiment of the present invention, a semiconductor device includes a substrate, a LDMOS device disposed in the substrate, the LDMOS device including a drain, a first guard ring disposed around and proximate the drain of the LDMOS device, and a second guard ring disposed around the first guard ring.

In accordance with another preferred embodiment of the present invention, a LDMOS device includes a substrate, the substrate including a first semiconductor type. A buried layer is formed in a top region of the substrate, the buried layer including a second semiconductor type. A doped semiconductor material is disposed over the buried layer, the doped semiconductor material being doped with the first semiconductor type. A deep well region is disposed within a portion of the doped semiconductor material, the deep well region comprising an annular ring shape. At least one first high voltage well region is formed within a portion of the doped semiconductor material, a second high voltage well region is formed within a portion of the doped semiconductor material, the second high voltage well region comprising an annular shape disposed within a central portion of the annular deep well region, and field dielectric is disposed over portions of the second high voltage well region and the at least one first high voltage well region. A gate dielectric is disposed over portions of the second high voltage well region, the at least one first high voltage well region, and a portion of the field dielectric, a gate of the LDMOS device is disposed over the gate dielectric, a source of the LDMOS device is formed in the second high voltage well region, and a drain of the LDMOS device is formed in the at least one first high voltage well region. The LDMOS device includes a first guard ring formed in the annular deep well region, and a second guard ring formed in the second high voltage well region, the second guard ring being formed in a central region of the first guard ring.

Advantages of embodiments of the present invention include providing a LDMOS device design that is current isolated, wherein leakage current is prevented from flowing from the drain to the substrate by the first and second guard rings, which function as an NPN parasitic transistor that self-isolates the drain side of the LDMOS device. Latch-up, early breakdown and reliability issues are prevented by the use of the first and second guard rings of the present invention in an LDMOS device. The drain may be subjected to both low and high voltages without experiencing leakage current, in accordance with embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an LDNMOS device, wherein an extended polysilicon gate is used on an extended drain field oxide to reduce surface electric fields (RESURF) and increase breakdown voltage. Embodiments of the invention may also be applied, however, to other LDMOS devices and structures. Although only one LDNMOS device is shown in each figure, there may be many LDNMOS devices formed in each step of the manufacturing process.

Figure 4:
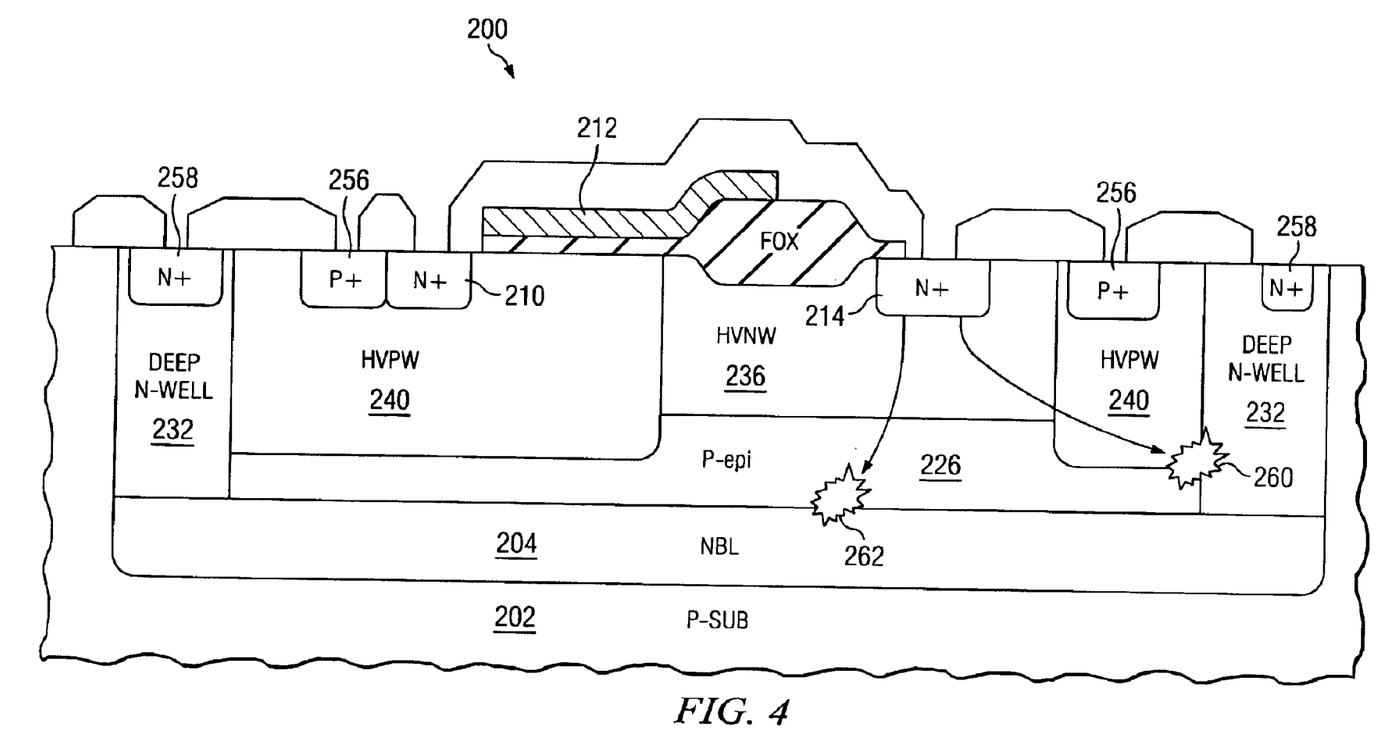
FIG. 4 shows a cross-sectional view of a preferred embodiment of the present invention, wherein two guard rings are disposed proximate the drain of an LDMOS device to provide isolation and prevent leakage current from the drain to the substrate.

With reference to FIG. 4, therein is shown a cross-sectional view of a preferred embodiment of the present invention. A first guard ring 256 is disposed proximate the drain 214 of the LDNMOS device 200. The first guard ring 256 comprises an annular ring disposed around the source 210, drain 214, and the gate 212 of the LDNMOS device 200, wherein one edge of the first guard ring 256 is more proximate the drain 214 of the device 200. A second guard ring 258 is formed around the first guard ring 256, as shown. The first and second guard rings 256 and 258 form an NPN parasitic transistor that prevents leakage current, at location 260 between HVPW 240 and deep NW 232, and location 262 between NBL 204 and P-epitaxial layer 226, as examples. Embodiments of the invention provide a novel isolated LDNMOS device 200 having a thick P-epitaxial layer 226 and deep NW 232 formed therein, which provide the ability to form an NPN parasitic transistor to self-isolate the drain 214. The LDNMOS device 200 having wrap-around isolation provided by guard rings 256 and 258 provides protection from both positive and negative voltages that may be applied to the drain 214 terminal.

Figure 5:
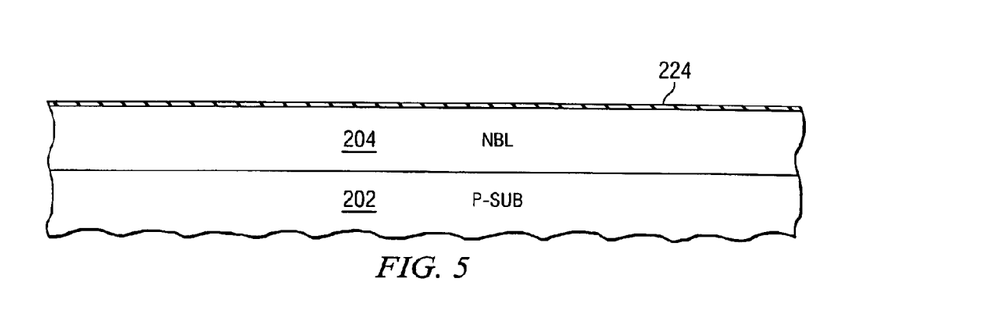
FIGS. 5 through 15 show cross-sectional views of a preferred embodiment of the present invention at various stages of manufacturing.

A preferred embodiment for a manufacturing process in accordance with an embodiment of the present invention will next be described with reference to FIGS. 5 through 15. Referring first to FIG. 5, a substrate 202 is provided. The substrate 202 preferably comprises a semiconductor material such as silicon, although other semiconductor materials may be used for the substrate, for example. The substrate 202 is preferably P-type, having a resistivity of 15 to 25 ohms per centimeter, as an example. The substrate 202 may alternatively comprise an N-type substrate and may comprise other resistivity values, for example.

A pad oxide 224 or dielectric is formed on the top surface of the substrate 202. The pad oxide 224 may be formed by heating the substrate 202 in the presence of oxygen at a temperature of 920° C., for example. The thickness of the pad oxide 224 may comprise a thickness of 350 Angstroms, as an example. The pad oxide 224 may alternatively be formed by other oxidation methods, and may comprise other thicknesses, for example.

An N+ buried layer 204 is formed in a top region of the substrate 202 proximate the substrate 202 top surface. The N+ buried layer (NBL) 204 is preferably formed by implanting dopants into the top surface of the substrate 202, for example. The dopant may comprise antimony (Sb), may be implanted at a dopant concentration of $10^{14}$ to $10^{15}$, and may be implanted at 80 to 90 keV, as an example. The dopant of the N+ buried layer 204 may then be driven into the substrate 202 top region by heating the substrate 202 to a temperature of 1000 to 1100° C. The N+ buried layer 204 formed preferably comprises a thickness of between about 4 to 5 µm, for example.

Figure 6:
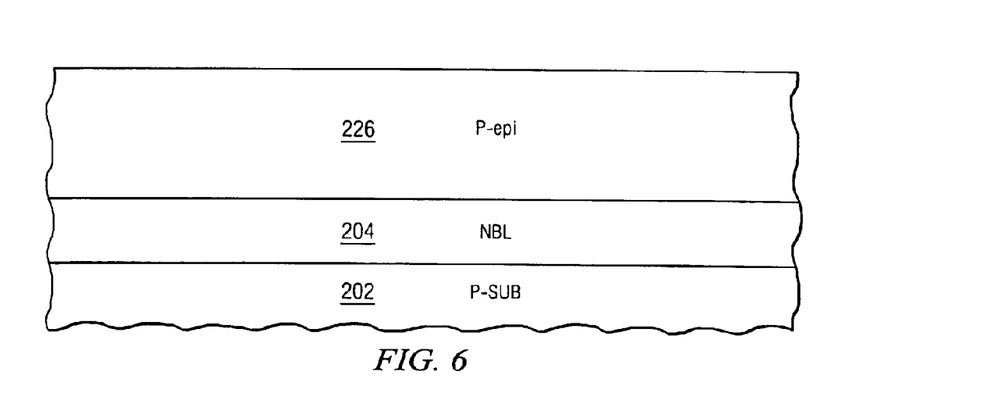

The pad oxide 224 is removed, a doped semiconductor material 226 is deposited over the N+ buried layer 204, as shown in FIG. 6. The doped semiconductor material 226 preferably comprises a P-type semiconductor such as silicon. The doped semiconductor material 226 is preferably deposited epitaxially, although other deposition methods may alternatively be used. The doped semiconductor material 226 is also referred to herein as a P-epi layer or P-epitaxial layer. The P-epi layer 226 is preferably deposited in a thickness of about 9 to 10 µm in one embodiment, although the P-epi layer 226 may comprise other thicknesses, for example. The P-epi layer 226 may be doped with boron (B), for example, and may comprise a resistivity of between about 30 to 60 ohms per centimeter, as an example.

Figure 7:
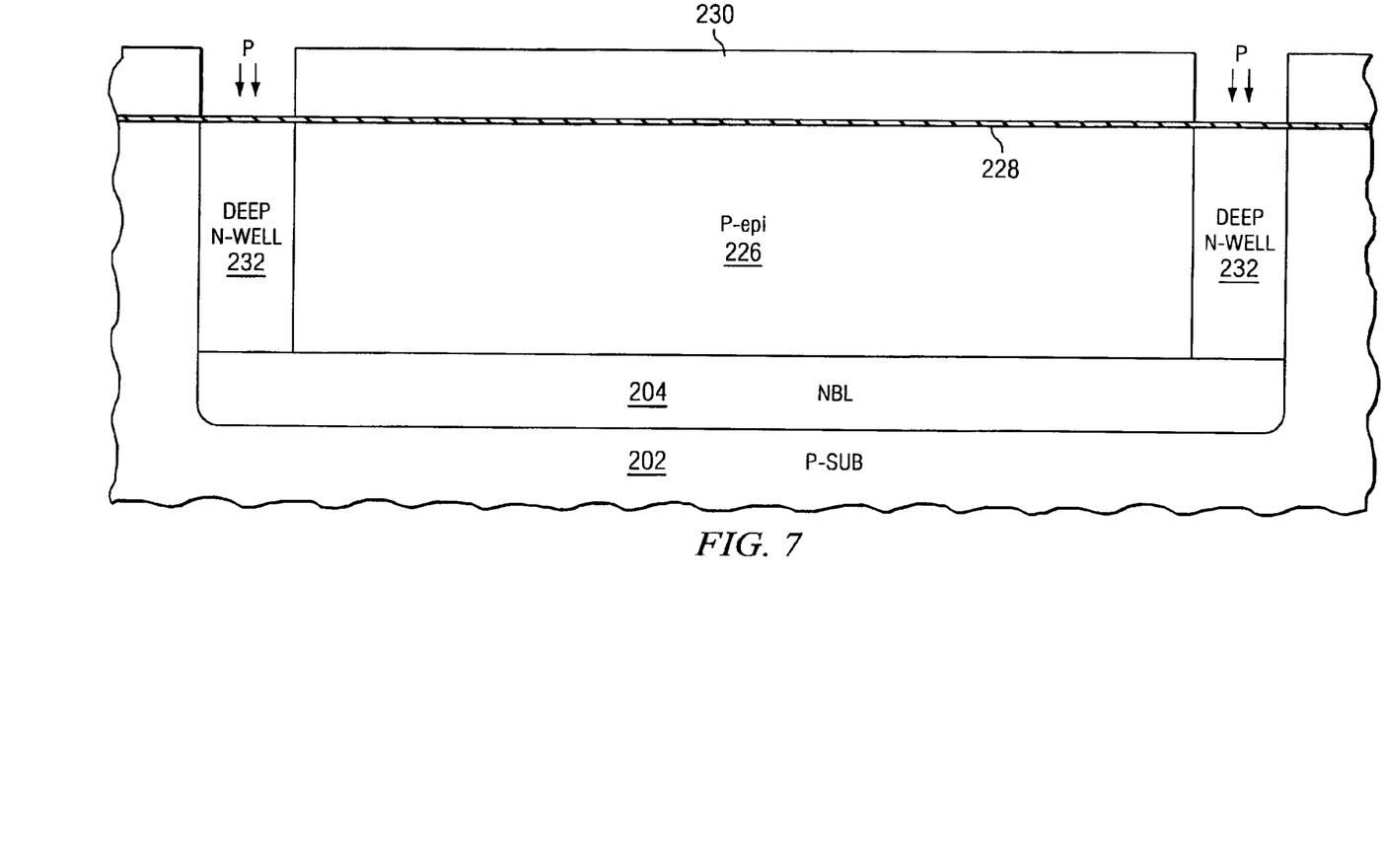

A pad oxide 228 or dielectric is formed over the P-epi layer 226, as shown in FIG. 7. The pad oxide 228 may be formed by heating the substrate 202 to a temperature of 920° C., and the pad oxide 228 may comprise a thickness of 350 Angstroms, as examples. A photoresist 230 is deposited over the pad nitride 228. The photoresist 230 is patterned using lithography techniques with the desired pattern for deep N-wells 232, which will be formed in the P-epi layer 226. The photoresist 230 is developed to expose the pad oxide 228 over the deep N-wells 232.

A high energy deep N-well 232 implantation is then performed in order to form the deep N-wells 232, as shown. The dopant may comprise phosphorus (P), and may comprise a dose of $10^{13}$ at about 300 keV, as examples. Alternatively, the deep N-well 232 may be formed by other implantation processes. The dopant for the deep N-well 232 is then driven in by heating the wafer to a temperature of 1000 to 1100° C., as an example. The deep N-well 232 may comprise a depth of about 9 µm, for example. In one embodiment, the depth of the N-well 232 implantation, and the depth of the N-well 232, comprise the entire thickness of the P-epi layer 226. While only a cross-sectional view is shown in FIG. 7, preferably the deep N-wells form an annular ring that is circular or oval in shape, although other continuous structures such as squares and rectangles may alternatively be used for the shape of the ring.

Figure 8:
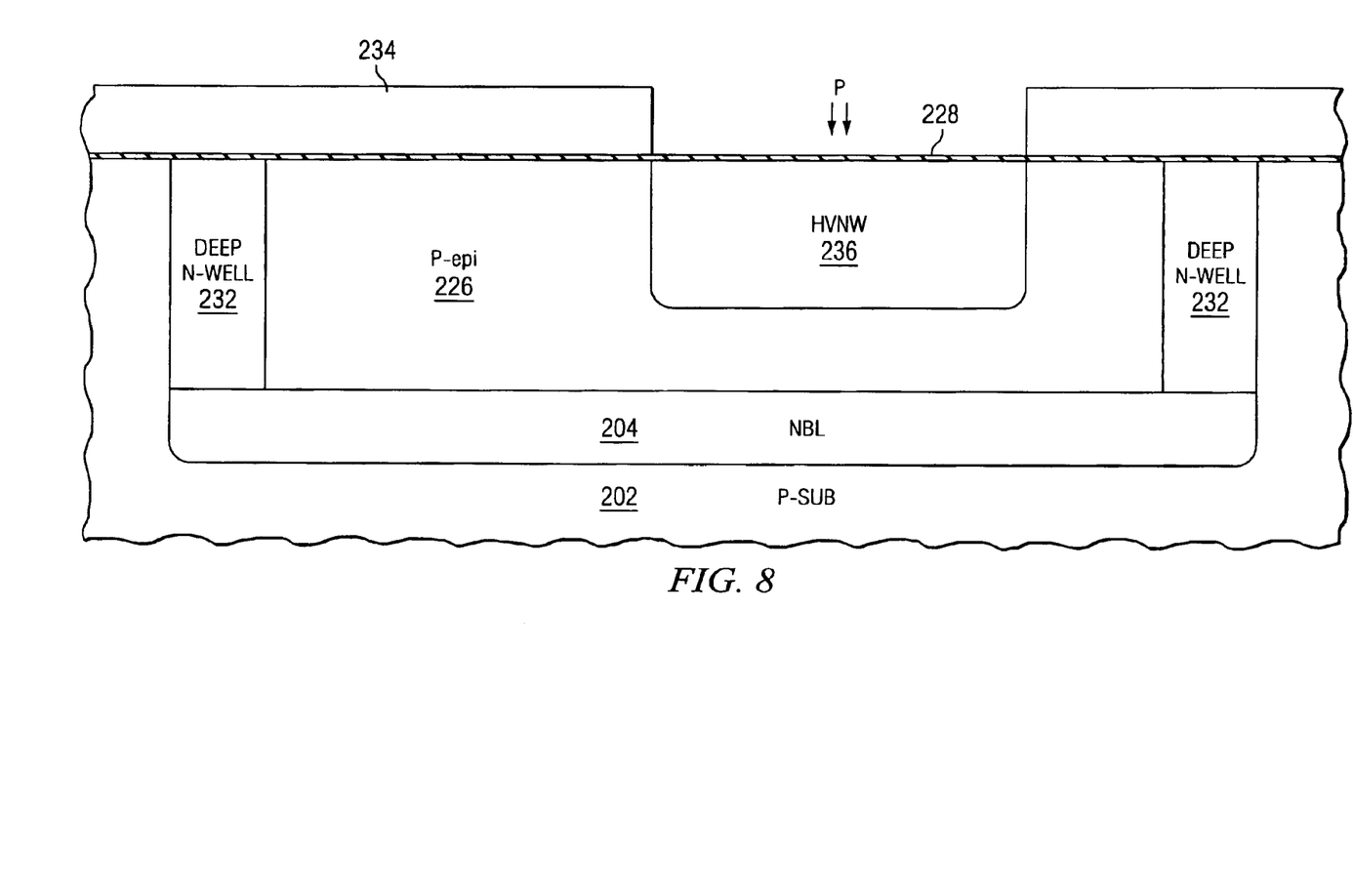

The photoresist layer 230 is removed, and another photoresist layer 234 is deposited over the top surface of the pad oxide 228, as shown in FIG. 8. The resist 234 is subjected to a lithography process to pattern the photoresist 234 with the pattern for high voltage N-well regions (HVNW) 236. The photoresist 234 is developed to expose the pad oxide 228 in the region of the HVNW 236. Exposed portions of the P-epi layer 226 are implanted with a dopant to form the HVNW regions 236. The dopant for the HVNW region 236 may comprise phosphorus, for example. The HVNW 236 may comprise a depth of between about 3.5 to 4 µm, and may be formed using an implantation of on the order of $10^{12}$ to $10^{13}$ dopant concentration at 120 keV, as examples.

Figure 9:
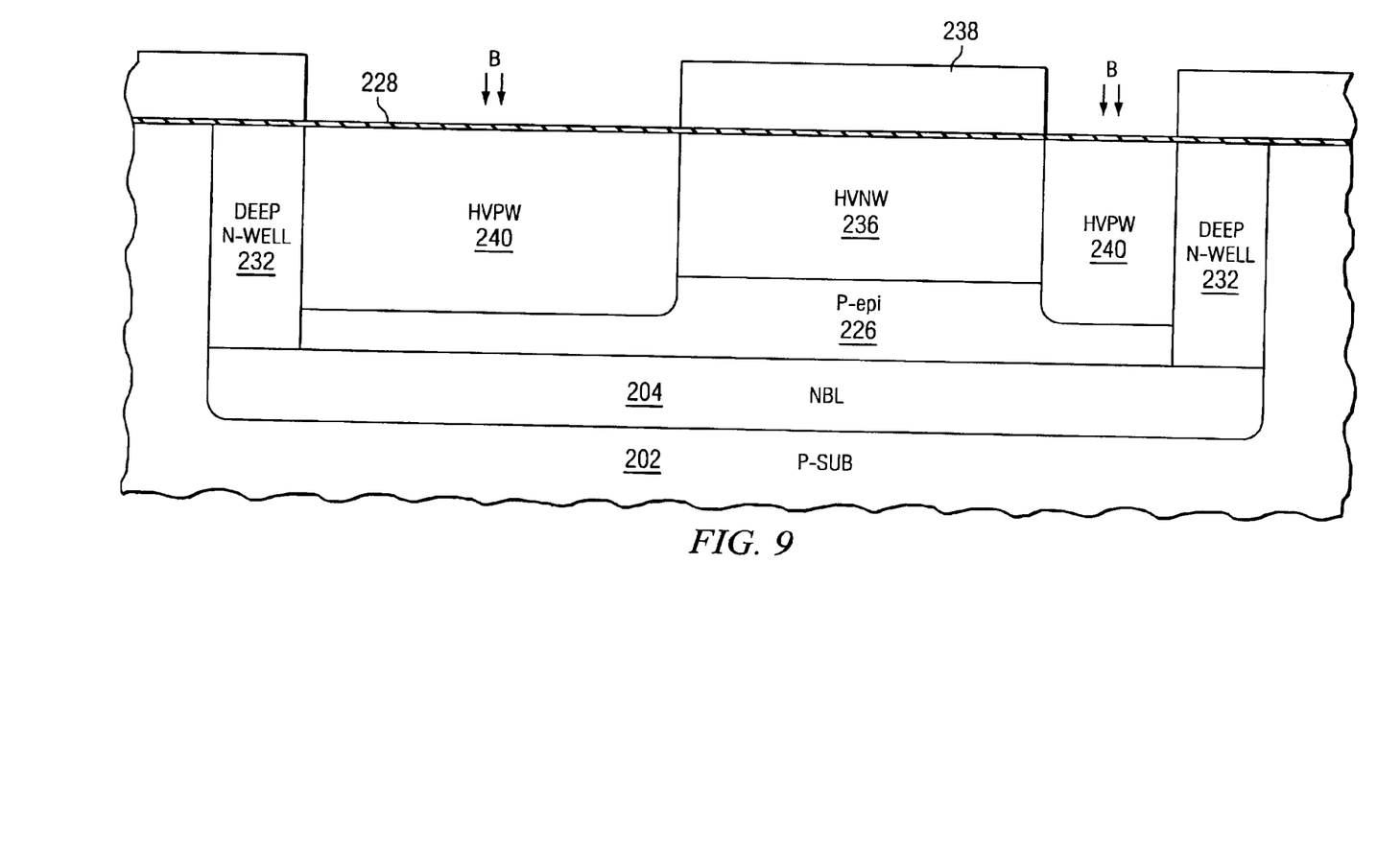

The photoresist 234 is removed, and then another photoresist layer 238 is deposited over the pad oxide 228, as shown in FIG. 9. The photoresist 238 is patterned with desired pattern for the high voltage P wells (HVPW) 240, which will be formed in the P-epi layer 226. The photoresist 238 is developed, and the P-epi layer 226 is doped with a dopant such as boron (B) to a depth of between about 4 and 4.5 µm to form the HVPW regions 240. In particular, an HVPW region 240 is formed between deep N well 232 and HVNW region 236, as shown. Similarly, an HVPW region 240 is formed between HVNW 236 and deep N-well 232. The HVPW 240 may be formed by doping the P-epi layer 226 with dopants in a concentration of $10^{12}$ to $10^{13}$ at a power of about 90 keV, as an example. The two HVPW regions 240 may also comprise an annular ring disposed within the annular ring formed by the deep N-wells 232, for example, in one embodiment.

Figure 10:
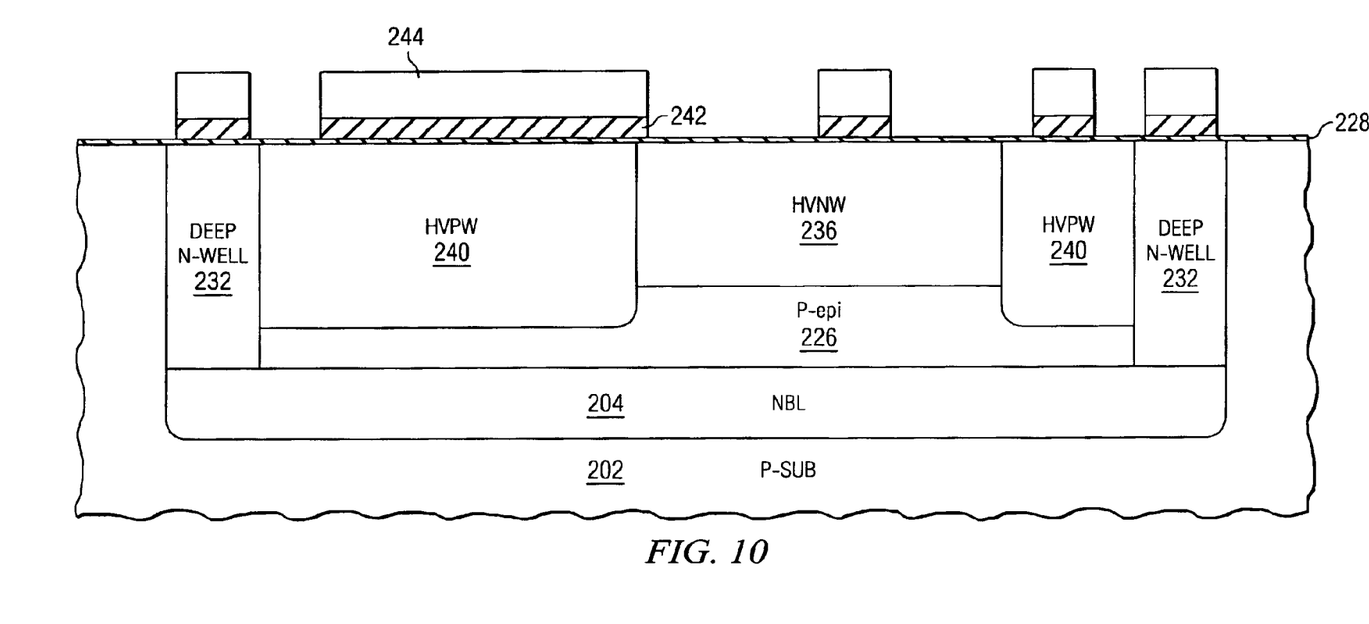

A nitride layer 242 comprising a dielectric is deposited over the pad oxide 228, as shown in FIG. 10. The nitride layer 242 may comprise a thickness of 1500 Angstroms, as an example, although the nitride layer 242 may comprise other thicknesses. A photoresist 244 is deposited over the nitride layer 242. The photoresist 244 is patterned with the desired pattern for the active region of the LDMOS device. The photoresist 244 is used as a mask to pattern the nitride layer 242. For example, the nitride layer 242 may be etched using a dry etch.

Figure 11:
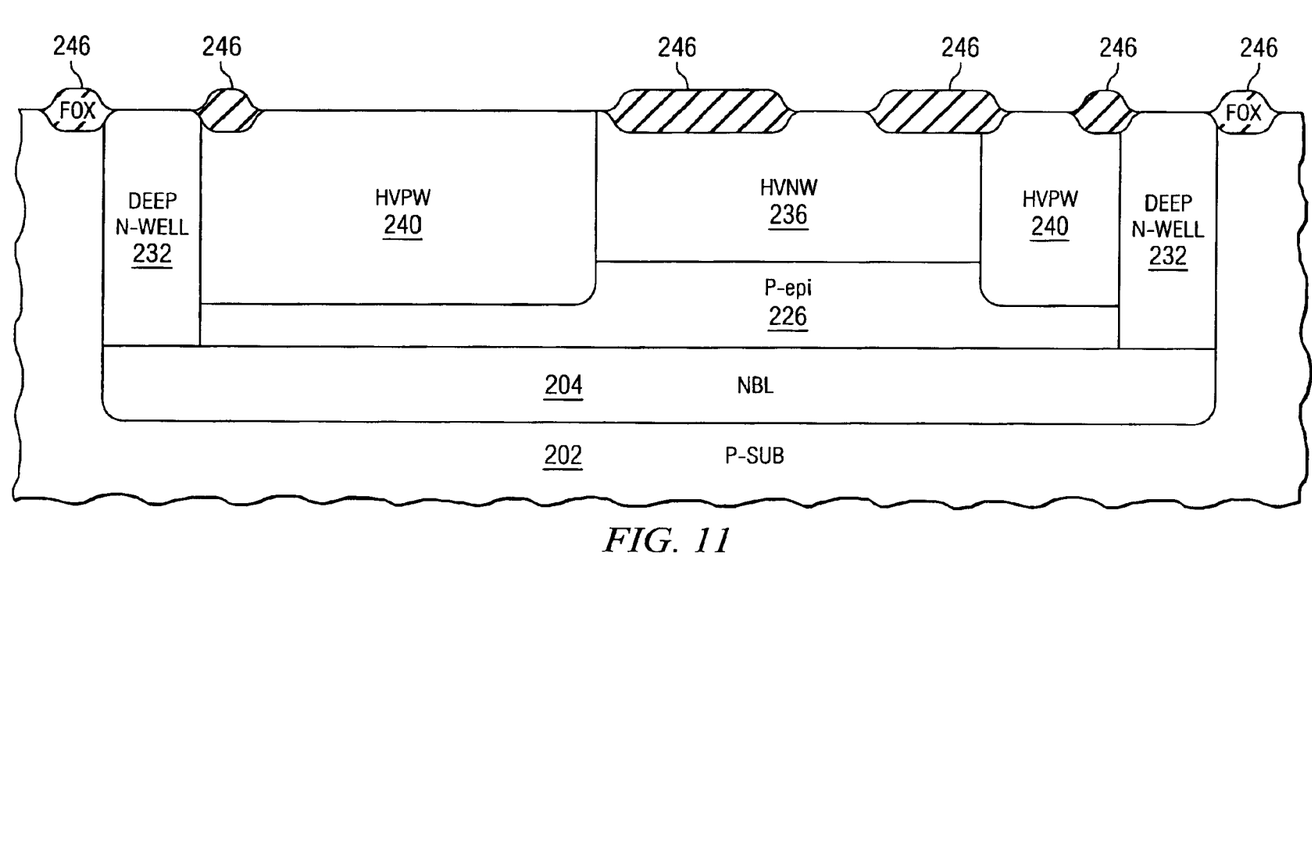

The photoresist 244 is stripped away, using $H_2SO_4$ as an example. The pad oxide 228 is preferably also removed during the photoresist 244 removal in regions not protected by the nitride layer 242. A field oxide (FOX) 246 or dielectric is formed over portions of the HVPW regions 240 and exposed portions of the HVNW region 236, using the nitride layer 242 as a mask, as shown in FIG. 11. The field oxide 246 may comprise silicon dioxide deposited by heating the substrate 202 in the presence of oxygen at a temperature of 980 degrees C., and may comprise a thickness of about 6000 Angstroms, as examples, although the field oxide 246 may alternatively comprise other thicknesses and materials. The nitride layer 242 is then stripped or removed, and the remainder of the pad oxide 228 is removed, as shown in FIG. 11.

Figure 12:
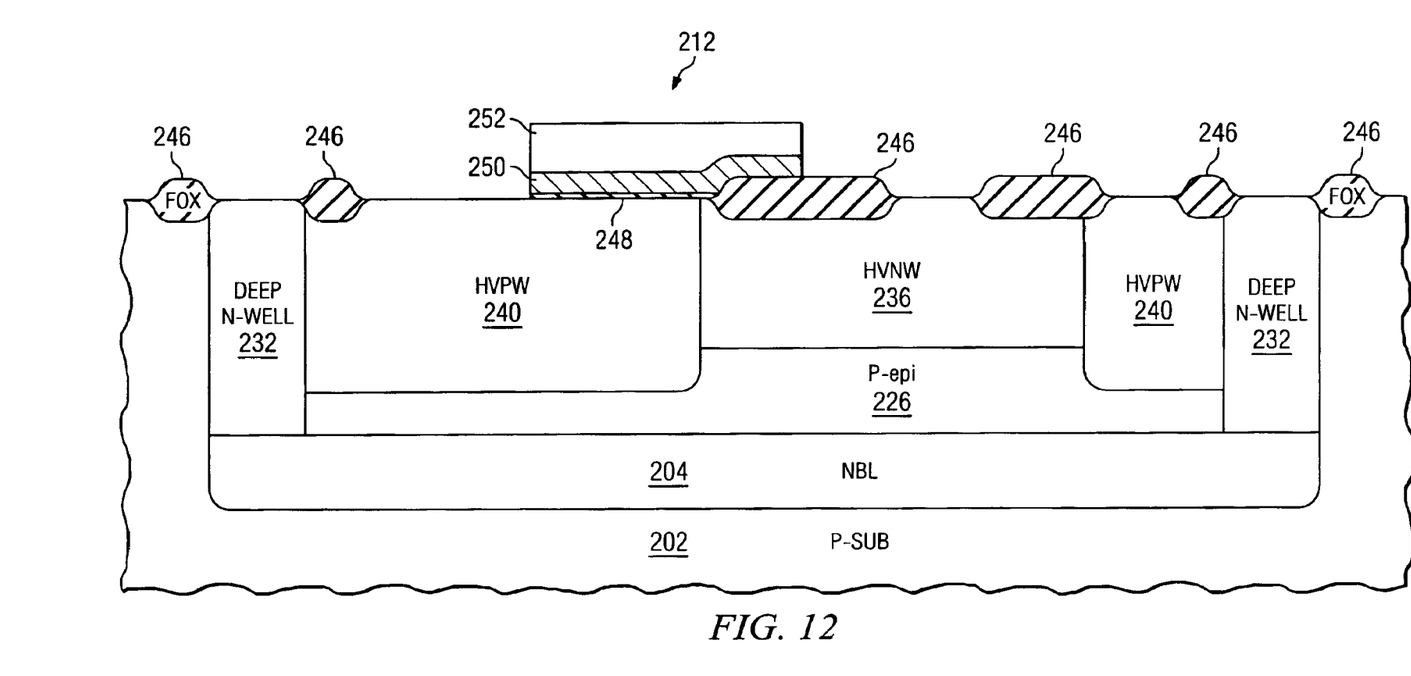

A gate oxide material layer 248 comprising a dielectric is deposited over the top surface of the field oxide 246 and exposed portions of the deep N-well regions 232, HVPW regions 240 and HVNW region 236, as shown in FIG. 12. A gate conductor material 250 is deposited over the gate oxide material layer 248. The gate conductor material 250 may comprise a first layer of polysilicon and second layer comprising a silicide, for example, to improve conductivity of the gate. A photoresist 252 is deposited over the gate conductor material 250, and the resist 252 is patterned with the desired pattern for the gate and gate oxide. The photoresist 252 is used as a mask to pattern the gate conductor material 250 and the gate oxide 248, and form the gate 212, as shown in FIG. 12. The gate 212 is preferably formed over portions of the HVPW and HVNW regions 240 and 236 and a portion of field oxide 246 over the HVNW region 236. The photoresist 252 is then removed.

Figure 13:
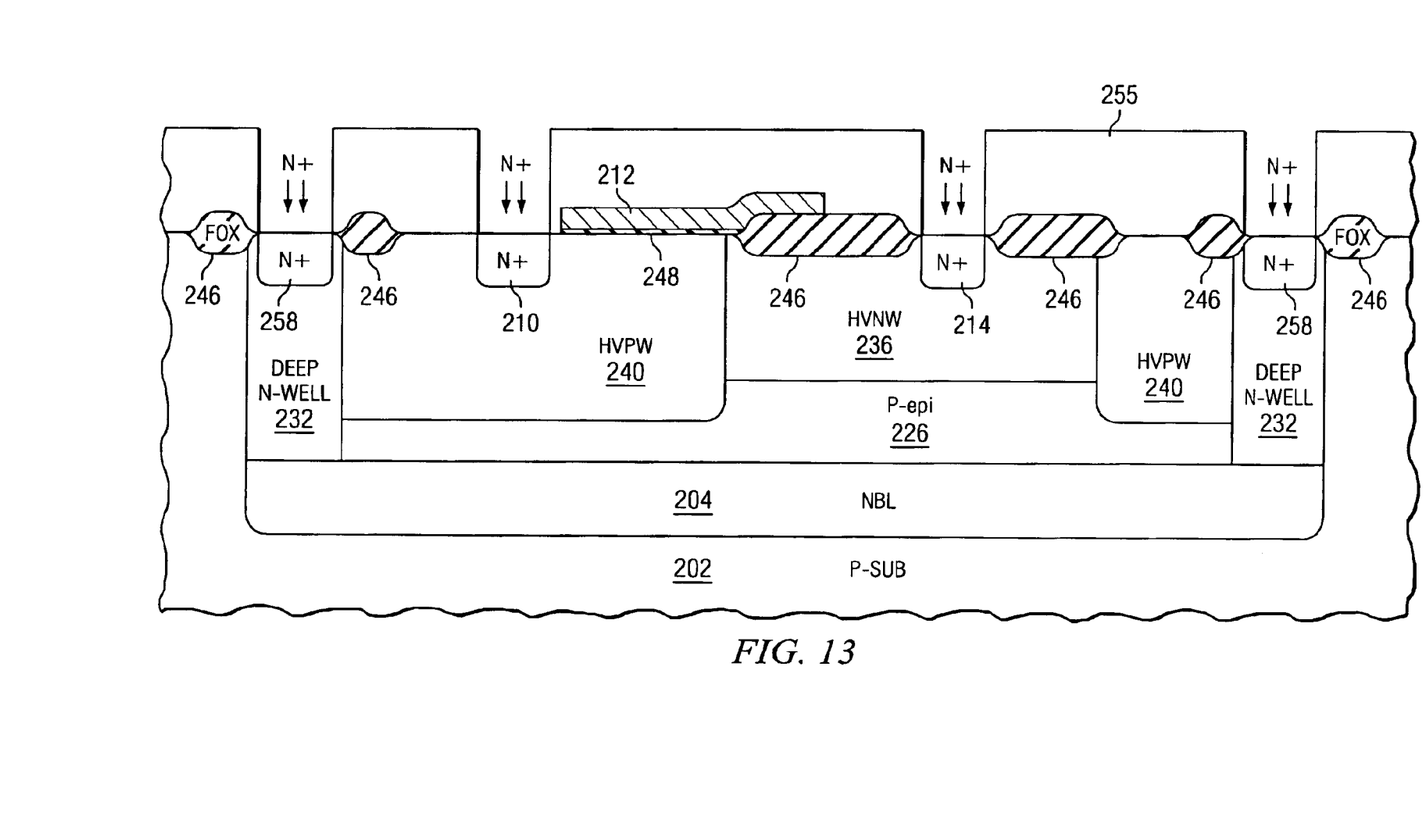

Another photoresist layer 255 is deposited over the wafer, as shown in FIG. 13, and the photoresist 255 is patterned for the N+ regions 256, 212, and 210. N+ region 210 comprises the source of the LDMOS device and N+ region 214 comprises the drain. The gate conductor material 250 of FIG. 12 forms the gate 212 of the LDMOS device shown in FIG. 13.

In accordance with preferred embodiments of the present invention, at the same time the source 210 and drain 214 are formed in the HVPW region 240 and HVNW region 236, respectively, preferably, a guard ring 256 is formed within deep N well region 232, as shown. More particularly, a preferred method of manufacturing the LDMOS device 200 comprises simultaneously doping the annular deep N-well region 232, a portion of the HVPW region 240 and a portion of the HVNW region 236 with an N+ dopant to form a guard ring 256 in the deep N-well region, a source 210 in the HVPW region, and a drain 214 in the HVNW region. The N+ dopant implant may comprise arsenic (As) as the dopant, implanted at a concentration of $10^{15}$ at about 50 keV, as examples. While only a cross-sectional view is shown in the Figures, regions 256 preferably comprise an annular ring that is disposed around the source 210, gate 212 and drain 214, with one edge of the guard ring 256 being disposed proximate the drain region 214 of the LDMOS device 200, within the annular deep N-well region 232.

Figure 14:
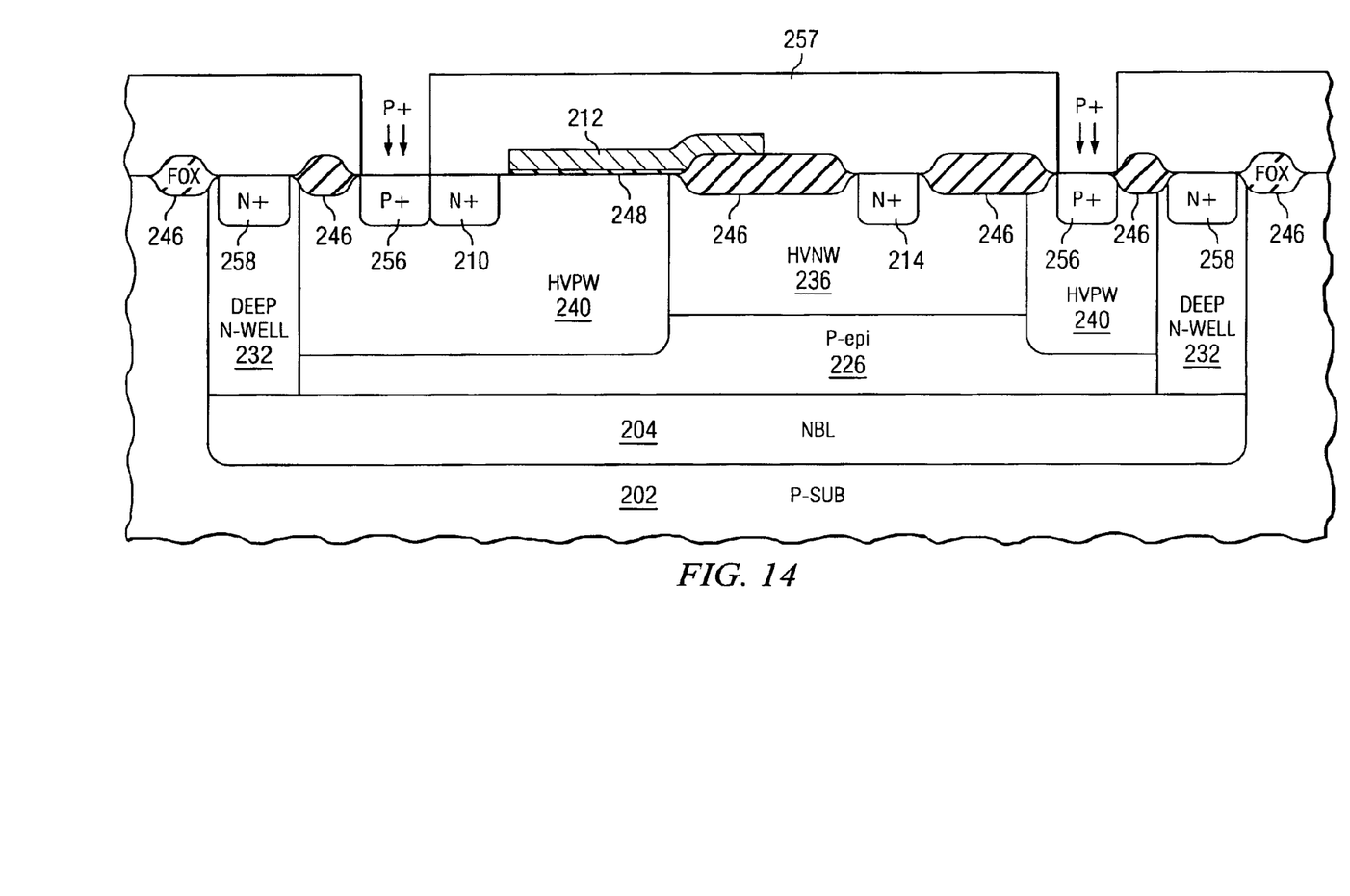
Figure 15:
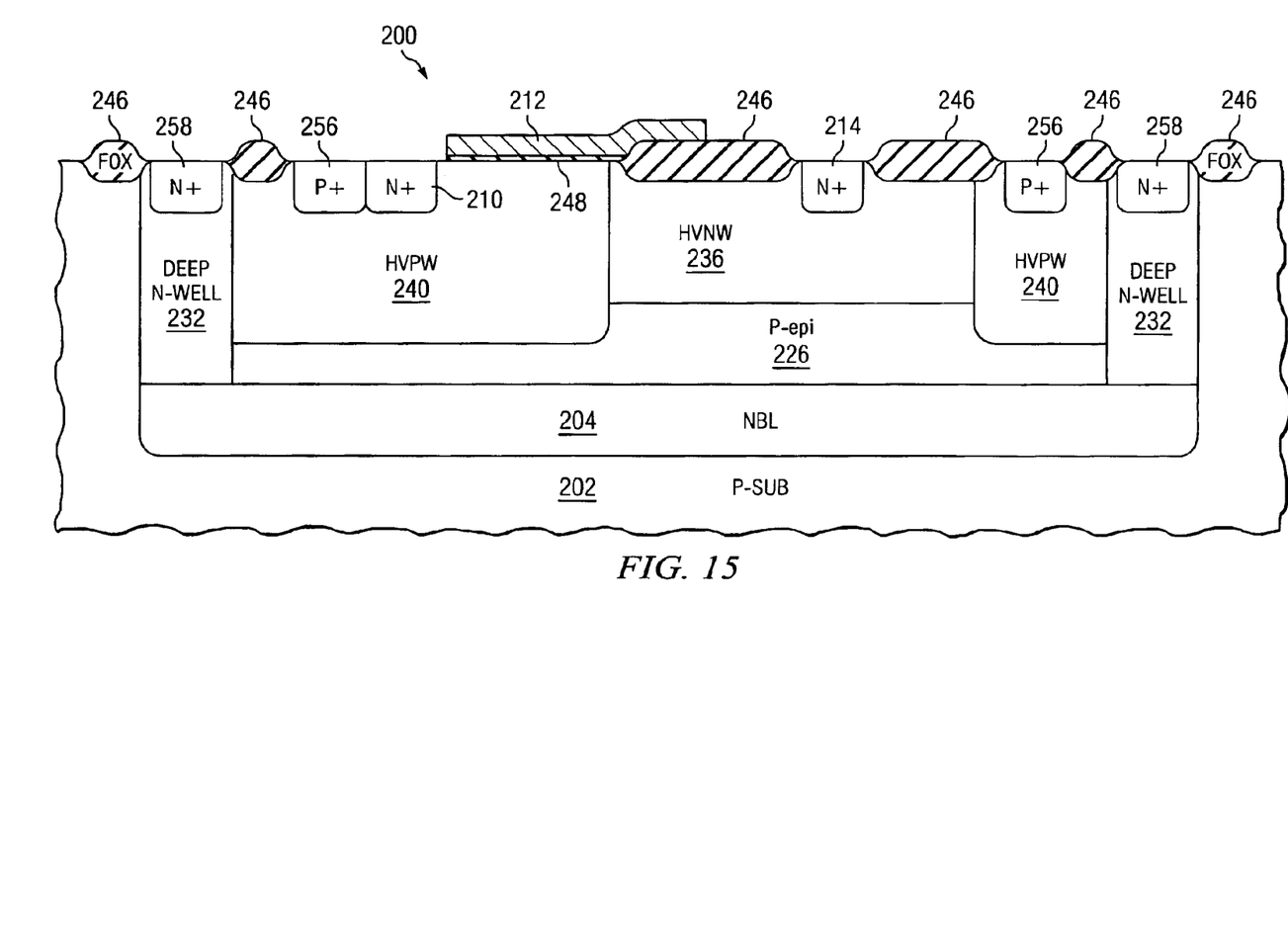

Shown in FIG. 14, the photoresist 255 is removed, and an additional photoresist layer 257 is deposited over the wafer, including the N+ regions 256, 210, 214 and the filled oxide 246, as examples. The photoresist 257 is patterned and developed, wherein the photoresist 257 comprises the pattern for P+ regions 256 that will be formed in the HVPW regions 240. The photoresist 257 is used as a mask while the P+ regions 256 are formed by doping the top surface of a portion of the HVPW regions 240 with a P+ dopant, as shown. The dopant may comprise B implanted at a concentration of $10^{15}$ at about 40 keV, as an example. The P+ regions 256 form an annular guard ring 256 that is disposed around and proximate the drain region 214 of the LDMOS device. The annular P+ guard ring 256 is preferably formed within a central region of the annular N+ guard ring 258, for example. The photoresist 257 is removed, leaving the structure shown in FIG. 15. Processing of the device 200 is then further continued to complete the manufacturing process.

Advantages of embodiments of the present invention include providing a LDMOS device 200 design that is current-isolated, wherein leakage current is prevented from flowing from the drain 214 to the substrate 202 by the first and second guard rings 256 and 258, which function as an NPN parasitic transistor that self-isolates the drain 214 side of the LDMOS device 200. Latch-up, early breakdown and reliability issues are prevented by the use of the first and second guard rings 256 and 258 of the present invention in an LDMOS device 200. The drain 214 may be subjected to both low and high voltages without experiencing leakage current, in accordance with embodiments of the present invention. A thicker P-epi layer 226 is used in a preferred embodiment of the invention, and deep N-wells 232 are formed, so that the first and second guard rings 256 and 258 may be formed in the doped well regions 240 and 232, respectively.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a substrate having a first conductivity type;
    a buried layer of a second conductivity type disposed in a top portion of said substrate;
    an epitaxial layer of the first conductivity type disposed over said buried layer;
    a lateral double-diffused metal oxide semiconductor (LDMOS) device disposed in the substrate, the LDMOS device including a drain;
    a first guard ring disposed around and proximate the drain of the LDMOS device; and
    a second guard ring disposed around the first guard ring.

2. The method according to claim 1, wherein the first guard ring and the second guard ring comprise a semiconductive material.

3. The semiconductor device according to claim 1, wherein the first guard ring comprises a P+ base guard ring, and wherein the second guard ring comprises an N+ collector guard ring.

4. The semiconductor device according to claim 3, wherein the first guard ring and second guard ring form a parasitic transistor, wherein the parasitic transistor electrically isolates the drain of the LDMOS.

5. The semiconductor device according to claim 1, wherein the buried and epitaxial layers disposed within the semiconductor comprise an N+ buried layer formed in a top portion of the substrate, and a P-epitaxial layer disposed over the N+ buried layer.

6. The semiconductor device according to claim 5, wherein the P-epitaxial layer comprises about 9–10 $\mu$m of doped semiconductor material.

7. The semiconductor device according to claim 5, further comprising a deep N-well formed within the P-epitaxial layer, wherein the first or second guard ring is formed in the deep N-well.

8. The semiconductor device according to claim 7, wherein the deep N-well comprises the entire thickness of the P-epitaxial layer.

9. A lateral double-diffused metal oxide semiconductor (LDMOS) device, comprising:
    a substrate, the substrate comprising a first semiconductor type;
    a buried layer formed in a top region of the substrate, the buried layer comprising a second semiconductor type;
    a doped semiconductor material disposed over the buried layer, the doped semiconductor material being doped with the first semiconductor type;
    a deep well region disposed within a portion of the doped semiconductor material, the deep well region comprising an annular ring shape and being doped with the first semiconductor type;

at least one first high voltage well region formed within a portion of the doped semiconductor material;

a second high voltage well region formed within a portion of the doped semiconductor material, the second high voltage well region comprising an annular shape disposed within a central portion of the annular deep well region;

field dielectric disposed over portions of the at least one first high voltage well region and the second high voltage well region;

a gate dielectric disposed over portions of the at least one fist high voltage well region, the second high voltage well region, and a portion of the field dielectric;

a gate of the LDMOS device disposed over the gate dielectric;

a source of the LDMOS device formed in the second high voltage well region;

a drain of the LDMOS device formed in the at least one first high voltage well region;

a first guard ring formed in the annular deep well region; and a second guard ring formed in the second high voltage well region, the second guard ring being formed in a central region of the first guard ring.

10. The LDMOS device according to claim 9, wherein the first semiconductor type comprises P-type, wherein the second semiconductor type comprises N+, wherein the deep well region comprises an N-well, wherein the at least one first high voltage well region comprises a high voltage N-well (HVNW) region; wherein the second high voltage well region comprises a high voltage P well (HVPW) region; wherein the dopant of the second semiconductor type comprises N+, and wherein the dopant of the first semiconductor type comprises P+.

11. The LDMOS device according to claim 9, wherein the P-doped semiconductor material comprises about 9–10 μm of P-epitaxial doped semiconductor material.

12. The LDMOS device according to claim 9, wherein the deep N-well region comprises the entire thickness of the P-doped semiconductor material.

13. The LDMOS device according to claim 9, wherein the field dielectric comprises a field oxide, and wherein the gate dielectric comprises a gate oxide.

* * * * *

UNITED STATES PATENT AND TRADEMARK OFFICE
CERTIFICATE OF CORRECTION

PATENT NO.   : 6,924,531 B2
DATED        : August 2, 2005
INVENTOR(S)  : Chen et al.

Page 1 of 1

It is certified that error appears in the above-identified patent and that said Letters Patent is hereby corrected as shown below:

Column 7,
Line 9, delete "N well," insert -- N-well --.

Column 9,
Line 15, delete "fist," insert -- first --.

Signed and Sealed this

Twentieth Day of September, 2005

JON W. DUDAS
*Director of the United States Patent and Trademark Office*